United States Patent
Adachi et al.

(10) Patent No.: US 9,117,994 B2
(45) Date of Patent: Aug. 25, 2015

(54) ELECTRONIC DEVICE

(71) Applicant: Panasonic Corporation, Osaka (JP)

(72) Inventors: Yusuke Adachi, Osaka (JP); Ryo Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 85 days.

(21) Appl. No.: 14/040,934

(22) Filed: Sep. 30, 2013

(65) Prior Publication Data

US 2014/0028157 A1 Jan. 30, 2014

Related U.S. Application Data

(60) Division of application No. 13/919,053, filed on Jun. 17, 2013, now Pat. No. 8,970,534, which is a continuation of application No. PCT/JP2012/006636, filed on Oct. 17, 2012.

(30) Foreign Application Priority Data

Oct. 19, 2011 (JP) .................. 2011-229365

(51) Int. Cl.
*H01L 41/047* (2006.01)
*G06F 3/041* (2006.01)
*G06F 3/01* (2006.01)
*H01L 41/083* (2006.01)
*G06F 3/0354* (2013.01)

(52) U.S. Cl.
CPC ............ *H01L 41/0472* (2013.01); *G06F 3/016* (2013.01); *G06F 3/03547* (2013.01); *G06F 3/041* (2013.01); *H01L 41/083* (2013.01)

(58) Field of Classification Search
CPC ..... H01L 41/39; H01L 41/47; H01L 41/0472; H01L 41/083; H01L 41/107; H05B 41/2822
USPC .................................... 310/359, 366
See application file for complete search history.

(56) References Cited

U.S. PATENT DOCUMENTS 3,200,354 A * 8/1965 White ........................... 257/416
3,792,321 A * 2/1974 Seifert .......................... 257/416
(Continued)

FOREIGN PATENT DOCUMENTS

| CN | 1523757 A | 8/2004 |
|---|---|---|
| CN | 101976145 A | 2/2011 |

(Continued)

OTHER PUBLICATIONS

Co-pending U.S. Appl. No. 13/919,053, filed Jun. 17, 2013 (application provided).

(Continued)

*Primary Examiner* — Thomas Dougherty
(74) *Attorney, Agent, or Firm* — Renner, Otto, Boisselle & Sklar, LLP

(57) ABSTRACT

Provided is an electronic device including: a base; a panel; a support for supporting the panel with respect to the base; and a vibrator for causing the panel to vibrate at a given frequency. The support includes a first region located at a part corresponding to a node of vibration of the panel, and a second region located at a part other than the node of the vibration of the panel. The support has a rigidity that is smaller in the first region than in the second region.

8 Claims, 6 Drawing Sheets

(56) References Cited

U.S. PATENT DOCUMENTS

| | | | |
|---|---|---|---|
| 5,118,982 A * | 6/1992 | Inoue et al. | 310/366 |
| 5,241,236 A * | 8/1993 | Sasaki et al. | 310/358 |
| 5,515,738 A | 5/1996 | Tamori | |
| 6,172,446 B1 | 1/2001 | Kanayama et al. | |
| 6,369,672 B1 | 4/2002 | Ikada | |
| 7,075,217 B2 * | 7/2006 | Vazquez Carazo | 310/359 |
| 7,723,902 B2 * | 5/2010 | Florian et al. | 310/359 |
| 7,948,149 B2 | 5/2011 | Koc | |
| 2003/0067252 A1 * | 4/2003 | Vazquez Carazo | 310/359 |
| 2005/0269913 A1 | 12/2005 | Sasaki et al. | |
| 2006/0097996 A1 | 5/2006 | Tabata | |
| 2009/0026891 A1 | 1/2009 | Koc | |
| 2009/0236948 A1 * | 9/2009 | Hoffmann et al. | 310/366 |
| 2010/0078505 A1 | 4/2010 | Kato | |
| 2010/0223999 A1 | 9/2010 | Onoe | |
| 2010/0238116 A1 | 9/2010 | Shin | |
| 2011/0102341 A1 | 5/2011 | Imai et al. | |
| 2011/0102343 A1 | 5/2011 | Imai et al. | |
| 2011/0205173 A1 | 8/2011 | Arai | |
| 2011/0291976 A1 | 12/2011 | Takada et al. | |
| 2011/0304569 A1 | 12/2011 | Kai et al. | |
| 2012/0075218 A1 | 3/2012 | Lin et al. | |
| 2012/0092272 A1 | 4/2012 | Miles et al. | |
| 2012/0162143 A1 | 6/2012 | Kai et al. | |

FOREIGN PATENT DOCUMENTS

| | | | | |
|---|---|---|---|---|
| DE | WO 2012/045867 A1 * | 4/2012 | | H01L 41/107 |
| JP | 05-198860 A | 8/1993 | | |
| JP | 7-131084 * | 5/1995 | | H01L 41/083 |
| JP | 11-160168 A | 6/1999 | | |
| JP | 2002-111087 | 4/2002 | | |
| JP | 2006-139371 A | 6/2006 | | |
| JP | 2006-173208 A | 6/2006 | | |
| JP | 2007-335664 A * | 12/2007 | | H01L 41/083 |
| JP | 2010-238222 A | 10/2010 | | |
| JP | 2011-096183 A | 5/2011 | | |
| JP | 2011-175519 A | 9/2011 | | |
| TW | 201030561 A | 8/2010 | | |

OTHER PUBLICATIONS

International Search Report for corresponding International Application No. PCT/JP2012/006636 mailed Jan. 15, 2013.

Notice of Reasons for Rejection for corresponding Japanese Application No. 2013-166215 mailed on Sep. 10, 2013.

Chinese Search Report with English language translation for corresponding Chinese Application No. 201280004430.X dated Mar. 3, 3014.

* cited by examiner

ELECTRONIC DEVICE

This is a continuation of International Application No. PCT/JP2012/006636, with an international filing date of Oct. 17, 2012, which claims priority of Japanese Patent Application No. 2011-229365, filed on Oct. 19, 2011, the contents of which are hereby incorporated by reference.

BACKGROUND

1. Technical Field

This disclosure relates to an electronic device including a touch panel.

2. Description of the Related Art

In recent years, an electronic device including, as input means, a touch panel formed on a surface of a display has been widely used. As one operating principle of the touch panel, a capacitive type is known. In this type, a change in capacitance between the operator's fingertip and a conductive film of the touch panel is measured to detect a touch position of the operator's fingertip on the touch panel.

In general, in the electronic device including the touch panel, the operator directly touches the surface of the touch panel to perform input operation. The operator cannot recognize the change in capacitance by the sense of touch even when the change in capacitance occurs at the time of contact to the surface of the touch panel. Therefore, the operator cannot determine whether or not the input operation has been appropriately performed based on the sense of touch of the fingertip. This fact has been a significant stress for the operator.

Japanese Patent Application Laid-open No. 2010-238222 discloses a touch panel with a touch sense presenting function, which is capable of detecting the input operation to the touch panel and vibrating the touch panel, to thereby provide an operational feeling by the sense of touch to the operator.

SUMMARY

This disclosure provides an electronic device including a touch panel, which is capable of presenting a sense of touch in a more improved manner.

According to an exemplary embodiment of this disclosure, there is provided an electronic device, including: a base; a panel; a support for supporting the panel with respect to the base; and a vibrator for causing the panel to vibrate at a given frequency, in which the support includes a first region located at a part corresponding to a node of vibration of the panel, and a second region located at a part other than the node of the vibration of the panel, and in which the support has a rigidity that is smaller in the first region than in the second region.

According to this disclosure, it is possible to provide the electronic device capable of reducing the difference in feeling of touch depending on touch positions.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

The inventors of this application studied in detail the mounting structure of the touch panel with a touch sense presenting function disclosed in Japanese Patent Application Laid-open No. 2010-238222. As a result, it has been found that there are cases where, depending on the position touched by the finger, the operator cannot sense the vibration of the touch panel in a sufficient level. In view of such a problem, the inventors of this application provide an electronic device capable of reducing the difference in feeling of touch depending on touch positions.

In the following, an embodiment of this disclosure is described in detail with reference to the drawings. Note that, needlessly detailed description is omitted in some cases. For example, detailed description of well-known matters and overlapping description for the substantially same configuration are omitted in some cases. This is for avoiding unnecessary and redundant description in the following, and facilitating the understanding of the person skilled in the art.

Note that, the inventors provide the attached drawings and the following description in order to provide sufficient understanding of this disclosure to a person skilled in the art. Therefore, it is not intended to limit the main subject of the description in the scope of claims by the attached drawings and the following description.

In the following, an electronic device 100 according to the embodiment is described with reference to the drawings. For the sake of easy understanding of the description, the long side direction of the electronic device 100 is referred to as X direction, the short side direction thereof is referred to as Y direction, and the thickness direction thereof is referred to as Z direction.

1. Configuration of Electronic Device

Figure 1:
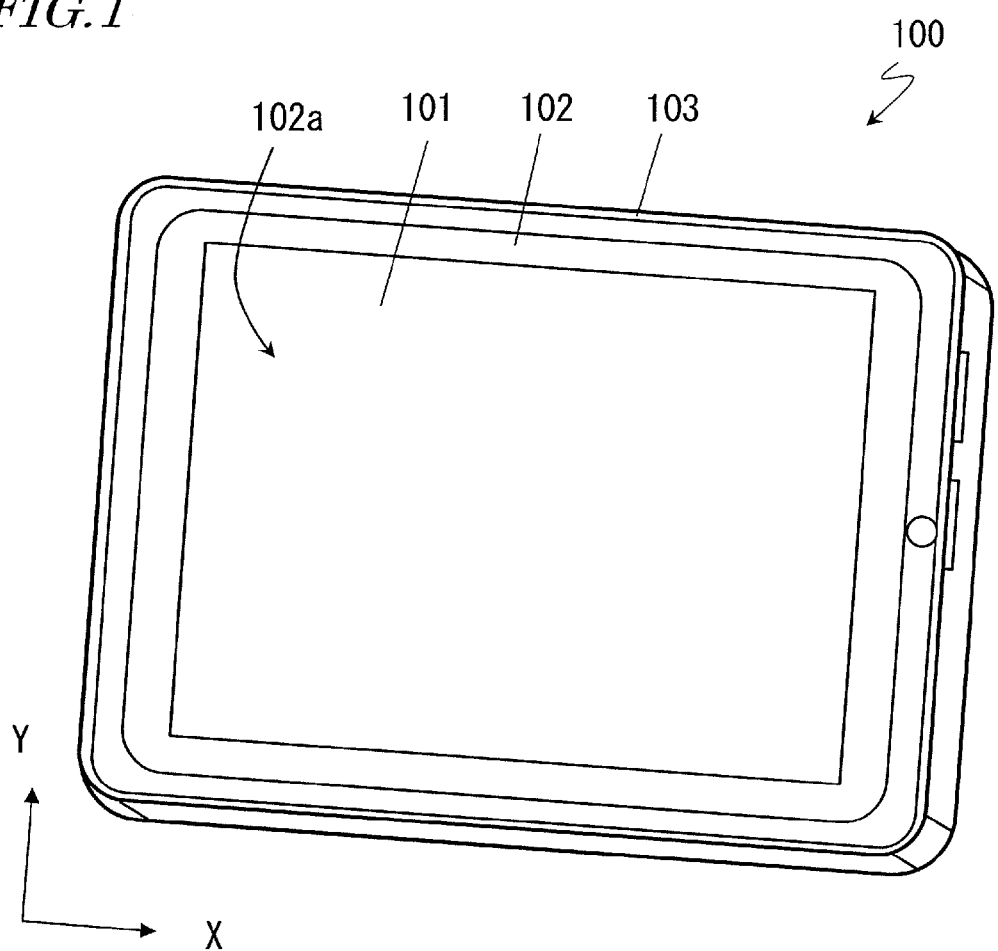
FIG. 1 is a perspective view of an outer appearance of an electronic device according to an embodiment of this disclosure.

FIG. 1 is a perspective view illustrating an outer appearance of the electronic device 100 on a display surface (front surface, main surface) 102a side. The electronic device 100 includes a display portion 101, a touch panel 102 arranged so as to cover the display portion 101, and a casing 103. The display portion 101 may be a liquid crystal display device, an organic electroluminescence display device, an electronic paper type display device, and the like.

Figure 2:
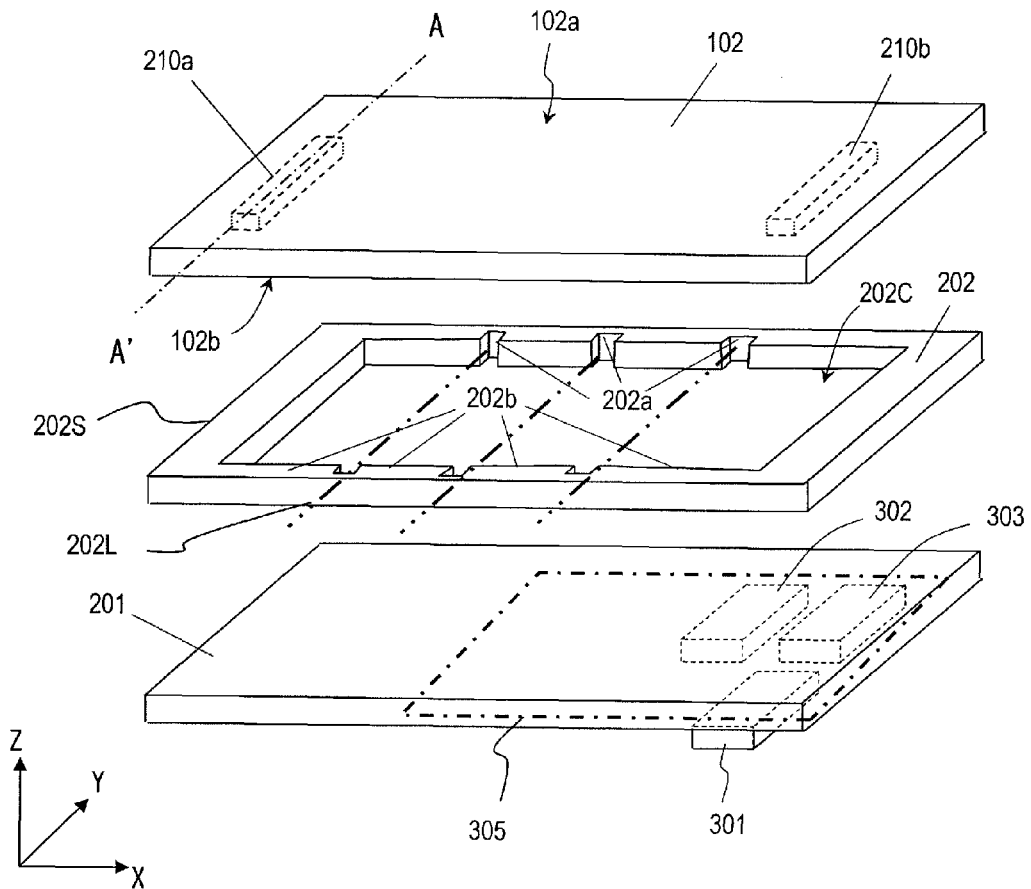
FIG. 2 is an exploded perspective view illustrating a configuration of the electronic device.

FIG. 2 is an exploded perspective view illustrating the configuration of the electronic device 100. As illustrated in FIG. 2, the electronic device 100 includes a base 201, the touch panel 102, a support 202, and vibrators 210a and 210b. The base 201 supports the touch panel 102. The base 201 is formed of a member having rigidity that enables the base 201 to support the touch panel 102 and the like, such as a metal and a resin. In this embodiment, the base 201 and the support 202 are provided as separate members, but the base 201 and the support 202 may be integrally formed. Further, the base 201 may be the display portion 101.

The electronic device 100 further includes a substrate 305 provided with, for example, a drive portion 301, an image processing portion 302, and a controller 303. The substrate 305 may be mounted on, for example, the base 201 on the opposite side to the touch panel 102. The drive portion 301 supplies a drive voltage to the vibrators 210a and 210b to vibrate the vibrators 210a and 210b. The image processing portion 302 processes an image signal as contents to be displayed on the display portion 101. The controller 303 includes an information processing circuit such as a microcomputer and a storage section for storing programs and data of the contents, such as a moving image, to be displayed on the display portion. Further, the controller 303 controls the display portion 101, the touch panel 102, the drive portion 301, and the image processing portion 302.

The touch panel 102 has, for example, a rectangular shape, and its size is, for example, 280 mm in the X direction, 180 mm in the Y direction, and 0.9 mm in the Z direction. The material of the touch panel 102 is, for example, a laminate of glass and a film having sensor electrodes formed thereon. The touch panel 102 has a Young's modulus of, for example, 70 GPa, and a specific gravity of 2,500 kg/m$^3$.

The touch panel 102 detects the touch operation performed by the operator. Specifically, the touch panel 102 has the main surface 102a, and is configured to detect the contact of a finger, a stylus, and the like by the operator on the main surface 102a of the touch panel 102, and/or the contact position on the main surface 102a. A single contact position may be detected, or a plurality of positions may be detected simultaneously. As the touch panel 102, a known type such as a pressure-sensitive type, a capacitive type, an optical type, and a surface acoustic wave type can be employed. The touch panel 102 is an example of a panel. The peripheral edge part of the touch panel 102 is supported by the support 202.

The touch panel 102 may be an on-cell type touch panel in which the touch panel 102 bonds on the display portion 101, or may be an in-cell type touch panel in which the display portion 101 itself has a function of detecting the touch operation. Further, the touch panel 102 may be transparent or opaque. In short, the touch panel 102 only needs to have the function of detecting the operator's touch operation.

The support 202 is held in contact with the peripheral edge of the touch panel 102 to support the touch panel 102 with respect to the base 201. In this embodiment, the support 202 is provided with respect to the entire peripheral edge of the touch panel 102. The support 202 is made of a material having a certain strength and elasticity, such as a resin, rubber, gel, and a spring element.

The support 202 is formed of four sides. Specifically, the support 202 has a frame shape including a pair of opposing long sides 202L and a pair of opposing short sides 202S, which correspond to the shape of the touch panel 102. With this, a space 202C surrounded by the support 202 is formed between the touch panel 102 and the base 201. With this space 202C, the touch panel 102 can vibrate without coming into contact with the base 201.

The support 202 includes a first region 202a and a second region 202b. As described in detail below, the first region 202a is located at a part corresponding to the node of the vibration when the touch panel 102 vibrates, and the second region 202b is located at a part other than the node the vibration. In this embodiment, the support 202 includes 2N (N is a natural number of 1 or more) first regions 202a. N first regions 202a are located in each of the pair of long sides 202L. The N first regions 202a located in one of the pair of long sides 202L and the N first regions 202a located in the other of the pair of long sides 202L are respectively located one by one on N straight lines parallel to a direction in which the short side 202S extends (Y direction).

As described above, in this embodiment, the base 201 and the support 202 are provided as separate members, but the base 201 and the support 202 may be integrally formed. In this case, of the base 201 formed integrally with the support 202, a part protruding from the base 201 so as to form the space 202C corresponds to the support 202.

In this embodiment, the electronic device 100 includes two vibrators 210a and 210b. The vibrators 210a and 210b are mounted on the peripheral edge portion of a rear surface 102b of the touch panel 102. Specifically, the vibrators 210a and 210b are each arranged in the vicinity of the short side of the touch panel 102 and near substantially the middle point of the short side so that the longitudinal direction of each of the vibrators 210a and 210b and the short side are parallel to each other. The vibrators 210a and 210b cause the touch panel 102 to vibrate in the vicinity of the short sides of the support 202.

As the vibrators 210a and 210b, for example, a piezoelectric element, a vibration motor, a linear actuator, a voice coil motor, an artificial muscle, or the like is used. In short, the vibrators 210a and 210b only need to be capable of converting electric energy or the like into vibration energy.

Figure 3:
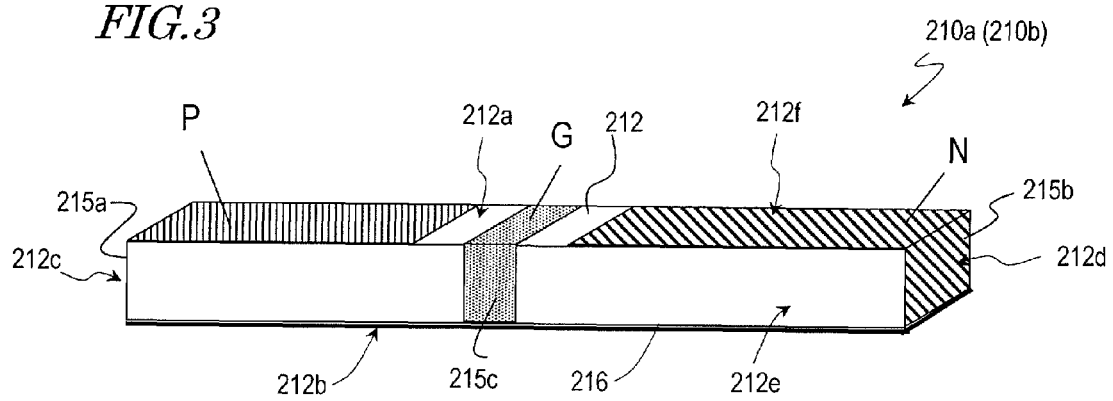
FIG. 3 is a perspective view of a vibrator.

FIG. 3 illustrates an example of the vibrators 210a and 210b in a case where the vibrators are each a piezoelectric element in this embodiment. The vibrators 210a and 210b each include a piezoelectric body 212, a first terminal P, a second terminal N, a reference electrode 216, and a third terminal G. As illustrated in FIG. 3, the vibrators 210a and 210b are each formed into, for example, a rectangular parallelepiped shape, and each have a mounting surface 212b and surfaces 212a, 212c, 212d, 212e, and 212f. The mounting surface 212b and the surface 212a correspond to a pair of main surfaces parallel to each other in the rectangular parallelepiped shape. The reference electrode 216 is provided so as to cover the entire mounting surface 212b. Further, the first terminal P, the second terminal N, and the third terminal G are formed on at least one of the surfaces 212a, 212c, 212d, 212e, and 212f for external connection. In this embodiment, the first terminal P is formed on the surface 212a. As described below, a first external electrode 215a, a second external electrode 215b, and a third external electrode 215c are formed on the surfaces 212c, 212d, and 212e, respectively.

Figure 4:
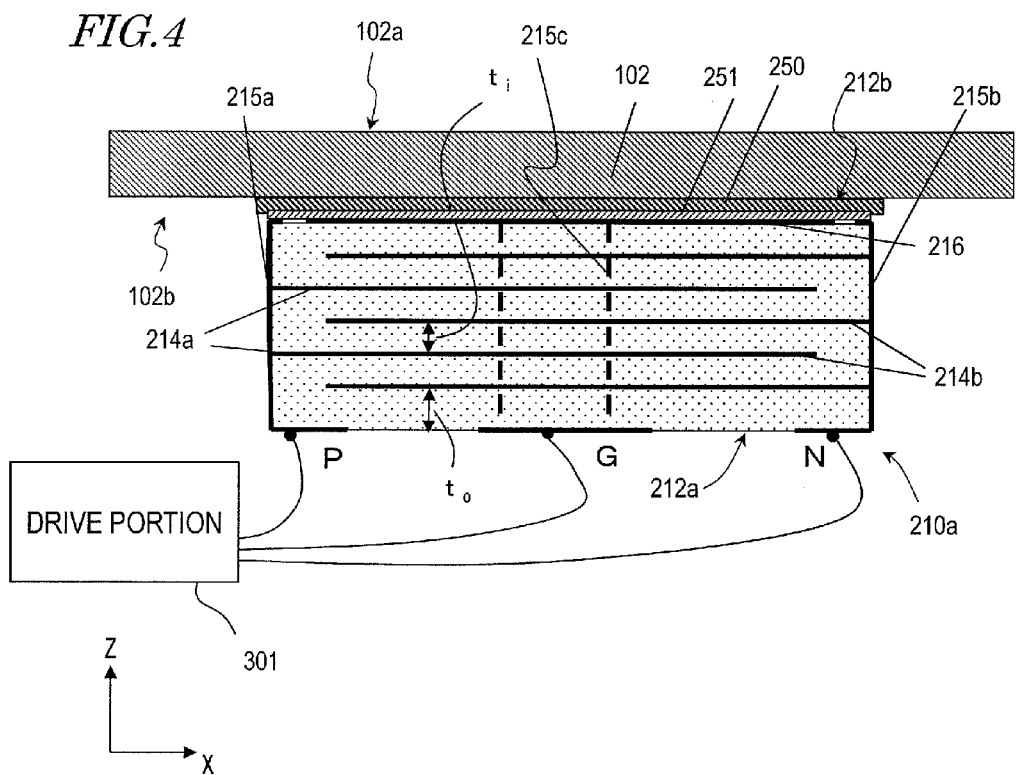
FIG. 4 is a sectional view taken along the line A-A' of FIG. 2.

FIG. 4 is a sectional view of the touch panel 102 and the vibrator 210a taken along the line A-A' of the electronic device 100 in FIG. 2. The vibrator 210b also has the same structure. As illustrated in FIG. 4, the vibrator 210a has its mounting surface 212b bonded so as to be opposed to the rear surface 102b of the touch panel 102 with an adhesive material 250 such as an epoxy based adhesive, a UV curable resin, and a double-sided tape. When the rear surface 102b of the touch panel 102 is provided with wiring and the like, and the reference electrode 216 of the vibrator 210a and the touch panel 102 may electrically connect to each other, the adhesive material 250 having an insulating property is used.

It is necessary to efficiently transmit the vibration of the vibrator 210a to the touch panel 102, and hence the adhesive material 250 generally has high rigidity. Note that, when the rigidity is too high, at the time of high or low temperature, a strain is easily generated due to the difference in thermal expansion coefficient between the vibrator 210 and the touch panel 102. Therefore, the adhesive material 250 has a smaller rigidity than the vibrator 210a and the touch panel 102.

As illustrated in FIG. 4, the vibrator 210a further includes a plurality of first internal electrodes 214a and a plurality of second internal electrodes 214b which are alternately arranged at given intervals inside the piezoelectric body 212. With this, the piezoelectric body 212 is divided into a plurality of layers sandwiched between the first internal electrode 214a and the plurality of second internal electrodes 214b. The plurality of first internal electrodes 214a are electrically connected to the first terminal P via the first external electrode 215a. Similarly, the plurality of second internal electrodes 214b are electrically connected to the second terminal N via the second external electrode 215b. The reference electrode 216 is electrically connected to the third terminal G via the third external electrode 215c. The piezoelectric body 212 is made of a piezoelectric material such as lead titanate, lead zirconate titanate, and lithium niobate.

The first external electrode 215a and the second external electrode 215b are made of a metal such as silver, palladium, copper, and nickel or a complex containing such metals by a method such as printing, sputtering, welding, and metallikon. Depending on the forming method, the first external electrode 215a and the second external electrode 215b may be partially formed also on the mounting surface 212b side. In order to prevent the first external electrode 215a and the second external electrode 215b formed on the mounting surface 212b side from coming into contact with the touch panel 102, an insulator layer 251 may be formed in advance on the vibrator 210a so as to cover the reference electrode 216. The insulator layer 251 may be made of an insulating material such as a resin including an epoxy resin and an acrylic resin, or glass. The vibrator 210a having the insulator layer 251 formed thereon is bonded onto the touch panel with the adhesive material 250. When the surface of the touch panel 102 is insulated, or when the influence of electromagnetic noise is small due to the sensing system of the touch panel 102, the insulator layer 251 is not always necessary. The first terminal P, the second terminal N, and the third terminal G of the vibrator 210a are electrically connected to the drive portion 301.

By applying a voltage to the piezoelectric body 212 via the first terminal P and the second terminal N, the vibrator 210a extends and contracts in accordance with the electric field caused by the voltage. In general, it is necessary to apply a high voltage in order to extend and contract the piezoelectric body. However, the touch panel 102 is expected to be touched by the finger, etc. of the operator, and hence an excessively high voltage cannot be applied. Therefore, in order to enable application of a sufficiently strong electric field to the piezoelectric body even at low voltage, the vibrator 210a has a laminate structure in which the plurality of first internal electrodes 214a and the plurality of second internal electrodes 214b are alternately arranged through intermediation of the piezoelectric body inside the piezoelectric body. With this, even when the intervals between the electrodes are narrowed and the voltage is reduced, a high electric field can be generated.

Further, in order to prevent electromagnetic noise into the touch panel 102 caused by the drive voltage for the vibrators 210a and 210b, the reference electrode 216 is located between the vibrator 210a and the touch panel 102. The reference electrode 216 is formed on the surface of each of the vibrators 210a and 210b on the touch panel 102 side, or on the internal electrode closest to the touch panel 102.

In FIGS. 3 and 4, the reference electrode 216 is formed on the surface of the vibrator 210a, but the reference electrode 216 may be provided separately from the vibrator 210a and be made of, for example, metal foil. In order to prevent unnecessary resonance, the thickness of the piezoelectric body may be set so that a thickness $t_o$ of a layer of the piezoelectric body located on the outermost side is larger than a thickness $t_i$ of a layer of the piezoelectric body sandwiched between the first internal electrode 214a and the second internal electrode 214b.

Figure 5A:
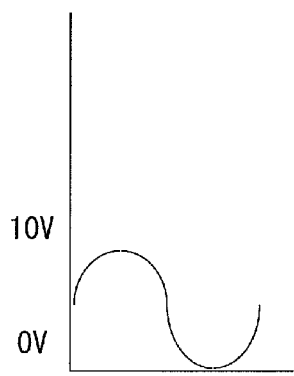
FIGS. 5A and 5B show voltage waveforms output from a drive portion.
Figure 5B:
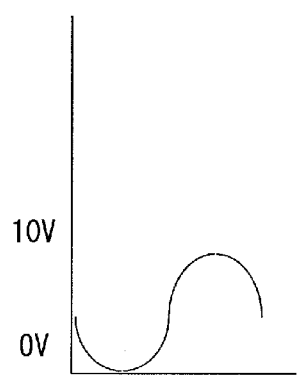
Figure 5C:
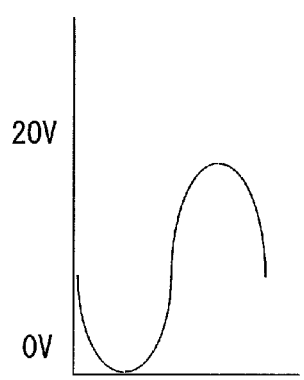
FIG. 5C shows a voltage waveform to be applied.

FIGS. 5A and 5B show examples of voltage waveforms output from the drive portion 301. A voltage having a waveform shown in FIG. 5A is applied to the first terminal P, and a voltage having a waveform shown in FIG. 5B is applied to the second terminal N. The phases of those two voltages are reversed with respect to each other. A voltage corresponding to the difference between the two voltages is applied to each layer of the piezoelectric body 212 of the vibrator 210a, and hence as shown in FIG. 5C, a voltage of twice the voltage of each terminal is applied to each layer of the piezoelectric body 212. A voltage having a reference potential, for example, a ground potential is applied to the third terminal G. With this, the reference electrode 216 is maintained to a voltage having a ground potential, and thus generation of the noise into the touch panel 102 can be prevented.

Figure 6A:
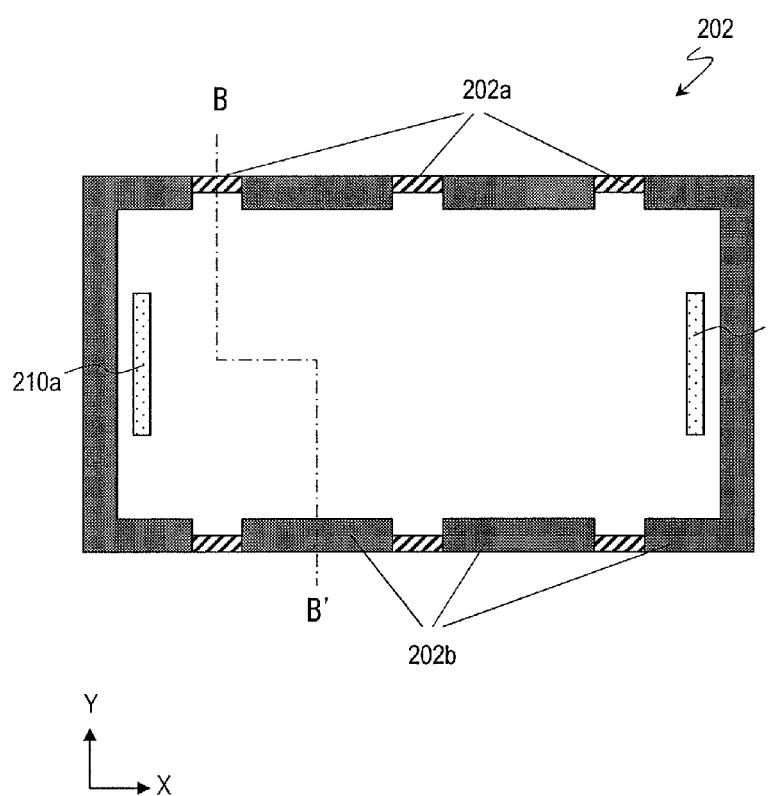
FIG. 6A is a plan view of a touch panel supported by a support to a base.
Figure 6B:
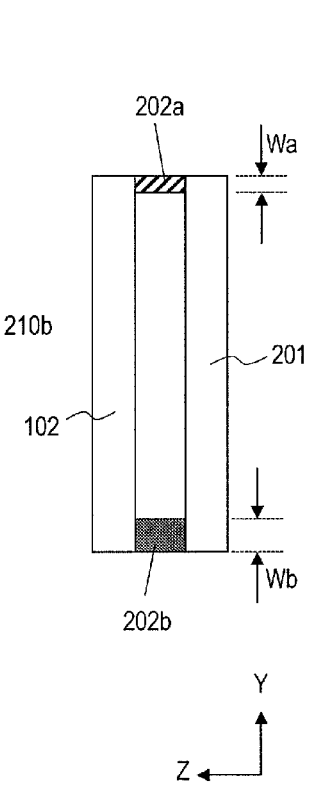
FIG. 6B illustrates a cross section taken along the line B-B' of FIG. 6A.

FIG. 6A is a plan view of the touch panel 102 supported by the support 202 to the base 201, and FIG. 6B illustrates a cross section taken along the line B-B' of FIG. 6A.

In the support 202, a width Wa of the first region 202a is smaller than a width Wb of the second region 202b in a direction (Y direction) perpendicular to the longitudinal direction on a plane parallel to the base 201. In this embodiment, the first region 202a and the second region 202b are formed of the same member. Therefore, the first region 202a having a smaller width has a smaller rigidity than the second region 202b. The rigidity refers to the easiness of contraction/extension in a direction perpendicular to the main surface 102a and the rear surface 102b of the touch panel 102.

The touch panel 102 is vibrated by the vibrators 210a and 210b. By appropriately selecting the shape, size, material, fixing method of the touch panel 102 and the vibration frequency, vibration amplitude, and vibration phase of the vibrators 210a and 210b, the touch panel 102 vibrates at a predetermined standing wave. In order to uniformly vibrate the entire touch panel 102 as much as possible, vibration is caused by the standing wave in a high-order vibration mode of second order or higher. In the high-order vibration mode, at portions other than the end portions of the touch panel 102, antinodes of vibration, which have a large amplitude, are generated at at least two specific locations, and a node of vibration, which has a small amplitude, is generated at at least one specific location. Also in the support 202, a part of a region close to the node of the vibration is formed of the first region 202a, and other regions are formed of the second region 202b. In a case where a plurality of standing waves are switched depending on the position touched by operator, the first region 202a is arranged at a position of the node of at least one standing wave.

2. Operation of Electronic Device and Vibration of Touch Panel

In the electronic device of this embodiment, for example, based on the instruction from the operator, data of the moving image contents stored in the storage section of the controller 303 is read out from the storage section based on the instruction of a information processing circuit of the controller 303, and is then processed by the image processing portion 302 to be displayed on the display portion 101.

Further, the touch panel 102 receives the input from the operator. For example, when the operator touches the front surface 102a of the touch panel 102 with his/her finger, the touch panel outputs information relating to the contact of the finger and the position of the contact on the front surface 102a to the controller 303.

The controller 303 receives the output from the touch panel 102, and outputs an instruction to vibrate the vibrators 210a and 210b to the drive portion 301. With this, the drive portion 301 vibrates the vibrators 210a and 210b to vibrate the touch panel 102. With the vibration of the touch panel 102, the operator recognizes that the input to the touch panel 102 by the operator has been received based on the sense of touch felt by the finger.

Based on the information relating to the contact position, the controller 303 may output the instruction to the drive portion 301 so that vibration conditions such as the amplitude level, the vibration pattern, and the vibration mode of the vibration of the vibrators 210a and 210b vary depending on the contact position. With this, the operator can recognize the difference of positions where the finger has touched.

The controller 303 further performs, for example, predetermined processing in the electronic device 100. For example, in accordance with the positions where the finger has touched, the controller 303 performs processing of temporarily stopping the moving image displayed on the display portion, processing of fast-forwarding the moving image, processing of changing the volume of the sound of the moving image, or the like.

Next, the vibration of the touch panel 102 is described in detail.

Figure 7A:
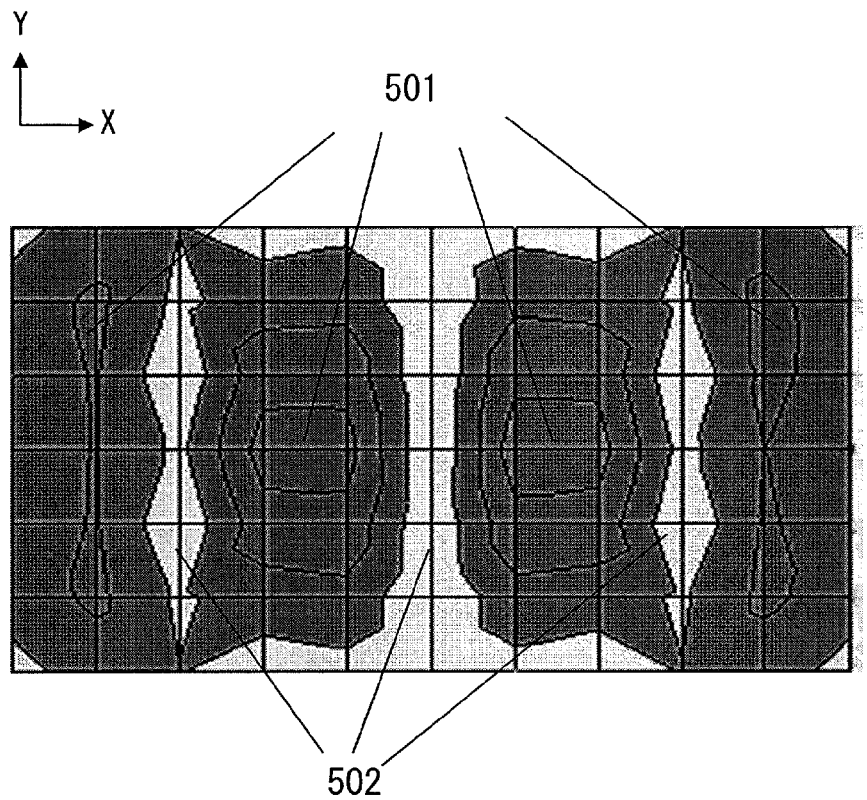
FIG. 7A shows a vibrational distribution of the touch panel when being driven at a certain frequency.
Figure 7B:
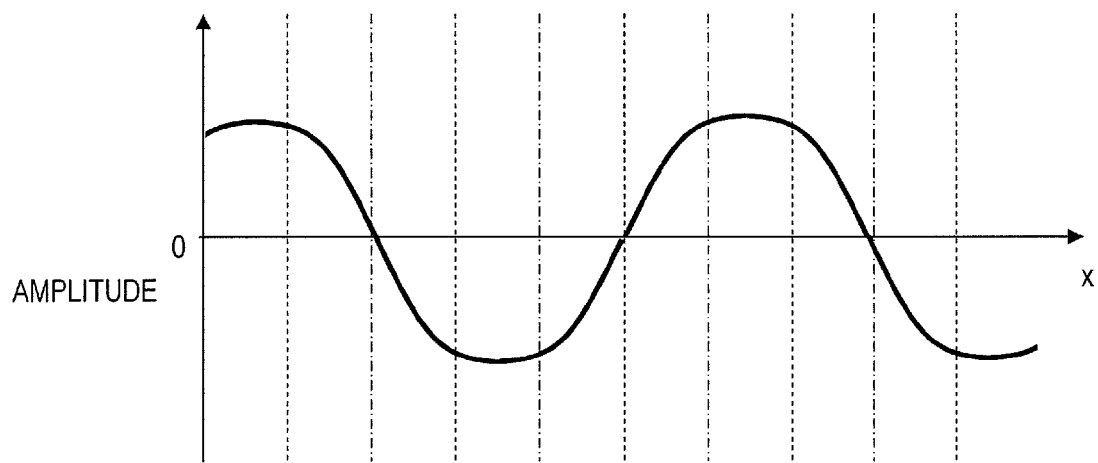
FIG. 7B shows the waveform of the amplitude.

FIG. 7A shows an example of the vibration amplitude of the standing wave in the touch panel 102 in a case where an antiphase sine wave with a voltage of 150 Vpp and a frequency of 370 Hz is applied from the drive portion 301 to the vibrators 210a and 210b. The antiphase herein refers to such a phase that, for example, the vibrator 210b contracts when the vibrator 210a extends. Specifically, the phases of the voltages applied to the vibrator 210a and the vibrator 210b are reversed with respect to each other. In the X direction, there are antinodes 501 of the vibration, which are locations where the amplitude is large, and nodes 502 of the vibration, which are locations where the amplitude is small. In the Y direction, no nodes 502 of the vibration are provided except for both end portions. FIG. 7B shows a vibration waveform at a center position in the Y direction, in which the horizontal axis represents the distance in the X direction, and the vertical axis represents the level of the amplitude. As illustrated in FIGS. 7A and 7B, the standing wave generated in the touch panel 102 has four vibration antinodes 501 and three vibration nodes 502 in the X direction. Such a vibration mode is called an f30 mode. In this case, the first suffix of f represents the number of nodes in the X direction, and the second suffix thereof represents the number of nodes in the Y direction.

Not only one but various modes of standing waves may be generated in the touch panel 102. As for selection of the vibration mode to be used, the vibration mode may be determined from the viewpoint of not only the uniformity of the vibration, but also the viewpoint that there is used such a frequency that can be easily felt by human or the sound is less liable to be heard.

The frequency that is easily sensed as touch by human is 100 Hz to 500 Hz, and when the frequency is 200 Hz to 400 Hz, the frequency can be more easily sensed as touch. On the other hand, when the frequency of the vibration exceeds 500 Hz, noise is generated due to the vibration of the panel. Therefore, from the viewpoint that the vibration is less liable to be heard, the frequency of 500 Hz or lower, or 400 Hz or lower may be selected. Further, when a plurality of vibration modes are selectively used, a strange sense of touch may be felt when there is a large difference in drive frequency. Therefore, in the case where a plurality of vibration modes are used, when the frequencies of the selected vibration modes are close to each other, such a strange feeling is less liable to be generated.

When the vibrators 210a and 210b are arranged at locations where the vibration amplitude in the vibration mode to be used is large on the touch panel 102, a standing wave having a large amplitude can be efficiently exited. In the case where the vibration mode shown in FIG. 7A is used, when the vibrators are arranged at the four vibration antinodes 501, a standing wave having a large amplitude can be most efficiently exited. However, generally, the vibrator is not transparent, and hence when the vibrator is arranged at the center portion of the touch panel, the display of the display portion 101 on the rear side thereof becomes invisible. Therefore, the vibrators 210a and 210b are arranged at end portions of the touch panel 102. Specifically, the vibrators 210a and 210b are arranged outside the display area of the display portion 101 and in a range of the touch panel 102. The end portion is not limited to a position close to the short side of the support 202, and only needs to be outside of the display area even when being located on slightly an inner side from the short side of the support. Also in this case, it is preferred that the vibrators 210a and 210b be set at end portions closer to the antinodes of the vibration. In the case of the vibration mode shown in FIG. 7A, it is desired that the vibrators 210a and 210b be arranged at the end portions of the touch panel 102 in the X direction and at the center portions in the X direction, or be arranged at four locations near the antinodes of the vibration in the X direction at the ends portions of the touch panel 102 in the Y direction.

As described above, the vibrators may be provided at two locations, one location, or three locations or more. Further, in this embodiment, the vibrators 210a and 210b are arrayed in the X direction, but may be arrayed in the Y direction, or may be arrayed in directions including the Y direction and the X direction. Further, the vibrators 210a and 210b may be arranged in symmetry in the touch panel 102, may be arranged at asymmetric positions. In any of the cases, the vibrators 210a and 210b only need to be arranged at parts as close to the antinodes as possible of the standing wave to be generated.

When the vibrators are provided at two locations or more, it is possible to determine whether to drive the provided vibrators in phase or in antiphase in accordance with the vibration mode of the standing wave to be exited and the positions of the vibrators. For example, when a plurality of vibrators are arranged at the antinodes of the vibration in the X direction, with respect to the vibrator arranged at the first antinode, the vibrators arranged at the third and fifth antinodes may be driven in phase with the vibrator arranged at the first antinode, and the vibrators arranged at the second and fourth antinodes may be driven in antiphase with the vibrator arranged at the first antinode.

As described above, the touch panel 102 vibrates in a high-order mode. The touch panel 102 vibrates in a high-order mode, and hence the node 502 of the vibration is present, and the vibration amplitude is small in the vicinity of the node 502 of the vibration. Therefore, in this embodiment, the rigidity of the first region 202a in the vicinity of the position of the node 502 of the vibration is set smaller than the rigidity of the second region 202b that supports the touch panel 102 at a position other than the node 502 of the vibration. Therefore, also in the vicinity of the node, in other words, in the vicinity of the first region 202a, the touch panel 102 is liable to vibrate, and the touch panel 102 may vibrate relatively larger in the vicinity of the first region 202a. Therefore, it is possible to reduce the fluctuations of the level of the vibration depending on the positions on the touch panel 102 as compared to the conventional case.

Further, the support 202 continuously supports the touch panel 102 over the entire peripheral edge portion. Therefore, no water or dust enters a space between the base 201 and the touch panel 102. With this, it is possible to provide the electronic device 100 having excellent water-proofing and dust-proofing properties.

Further, the support 202 is formed of a single member, and supports the touch panel 102. With this, a desired effect can be obtained with a small number of parts, and the number of assembly steps can be reduced, which contributes to reduction in cost of the electronic device 100.

Further, the vibrators 210a and 210b each include the reference electrode 216 on the mounting surface 212b, and the reference electrode is grounded to the ground level. Therefore, the reference electrode can prevent the noise that may be generated when the vibrators 210a and 210b are driven from being transmitted to the touch panel 102, and thus the detection in the touch panel 102 can be stably performed.

3. Effects, Etc.

As described above, in this embodiment, the electronic device 100 includes the base 201, the touch panel 102, the support 202 for supporting the touch panel 102 with respect to the base 201, and the vibrators 210a and 210b for causing the touch panel 102 to vibrate at a given frequency. The support 202 includes the first region 202a located at a part corresponding to a node of vibration of the touch panel 102, and the second region 202b located at a part other than the node of the vibration of the touch panel 102. The support 202 has a rigidity that is smaller in the first region 202a than in the second region 202b. Therefore, also in the vicinity of the node of the vibration, the touch panel 102 is liable to vibrate, and the fluctuations of the level of the vibration depending on the positions on the touch panel 102 can be reduced as compared to the conventional case.

Further, in this embodiment, the touch panel 102 has a rectangular shape, and the support 202 is configured to come into contact with a peripheral edge of the touch panel 102 to support the touch panel 102 with respect to the base 201. The support 202 has a frame shape formed of a pair of opposing long sides and a pair of opposing short sides, and a space surrounded by the support 202 is formed between the touch panel 102 and the base 201. Therefore, the touch panel 102 is stably supported by the base 201, and can vibrate.

The vibrators 210a and 210b cause the touch panel 102 to vibrate in a vicinity of the pair of short sides inside the space.

The support 202 includes 2N (N is a natural number of 1 or more) first regions 202a, and N first regions are located at each of the pair of long sides. The N first regions 202a located at one of the pair of long sides and the N first regions 202a located at another of the pair of long sides are respectively one by one on N straight lines parallel to a direction in which the pair of short sides extends. With this, when the touch panel 102 vibrates in a high-order mode, the first region 202a can be arranged at the node of the vibration.

The first region 202a and the second region 202b of the support 202 are made of a first material and a second material, respectively, and the first material has a rigidity smaller than a rigidity of the second material. Alternatively, in a plane perpendicular to a direction in which the long side or the short side of the support 202 extends, a cross section area of the first region 202a is smaller than a cross section area of the second region 202b. Alternatively, on a plane parallel to the base 201 and in a direction perpendicular to a direction in which the long side or the short side extends, a width of the first region 202a is smaller than a width of the second region 202b. With this, the rigidity of the first region 202a can be set smaller than that of the second region 202b.

The vibrators 210a and 210b are each a piezoelectric element. Further, the vibrators 210a and 210b are bonded onto the touch panel 102. Further, the vibrators 210a and 210b each include the reference electrode 216 connected to a reference potential on a surface to be bonded onto the touch panel 102. With this, it is possible to prevent the noise that may be generated by the drive of the piezoelectric element from diffusing into the touch panel 102, and the touch panel 102 can stably detect the operation performed by the operator.

Further, the vibrators 210a and 210b each vibrate a part of the touch panel 102 in the vicinity of a part of an antinode of the vibration. With this, the touch panel 102 can be efficiently vibrated. Further, the touch panel 102 vibrates in a high-order vibration mode. Thus, fluctuations of the level of the vibration inside the touch panel 102 can be reduced.

The panel is a touch panel, and the electronic device further includes a display portion. In this manner, the electronic device of this embodiment can be suitably applied to a personal digital assistant such as a smart phone, an electronic book, and a tablet.

The electronic device 100 further includes the drive portion 301 for driving the vibrators 210a and 210b, and the controller 303 for receiving a signal indicating an input from the touch panel 102 in response to the designation from the operator based on contact of an arbitrary position in an input surface of the touch panel 102, and outputting, to the drive portion 301, a control signal for driving the vibrators 210a and 210b based on the signal. Further, the controller 303 outputs the control signal to the drive portion 301 so that the touch panel 102 vibrates in different vibration conditions in accordance with a position designated by the operator. With this, the operator can know by the sense of touch that the touch panel 102 has received the input of the operator, and thus an excellent operability can be obtained.

Further, in this embodiment, the piezoelectric element includes the piezoelectric body 212 having the mounting surface and at least one another surface, the plurality of first internal electrodes 214a and the plurality of second internal electrodes 214b alternately arranged at given intervals inside the piezoelectric body 212, the first terminal P electrically connected to the plurality of first internal electrodes 214a and formed on the at least one another surface, the second terminal N electrically connected to the plurality of second internal electrodes 214b and formed on the at least one another surface, the reference electrode 216 formed on the mounting surface of the piezoelectric body 212, and the third terminal G electrically connected to the reference electrode 216 and formed on the at least one another surface.

The reference electrode is provided, and hence it is possible to prevent the noise caused by the drive of the piezoelectric element from transmitting to the outside of the piezoelectric element from the mounting surface. A part of the piezoelectric body, in which the plurality of first internal electrodes and the plurality of second internal electrodes are arranged, is divided into a plurality of layers by the plurality of first internal electrodes and the plurality of second internal electrodes, and, of the plurality of layers, a layer located on the outermost side has a thickness larger than a thickness of a layer located inside. With this, unnecessary resonance can be prevented.

4. Other Embodiments

As described above, as an example of a technology disclosed in this application, the above-mentioned embodiment has been described. However, the technology in this disclosure is not limited thereto, and is also applicable to embodiments that have been appropriately subjected to changes, replacements, additions, and omissions. Further, respective components described in the embodiment above may be combined to establish a new embodiment. In the following, other embodiments are exemplified.

In the above-mentioned embodiment, description has been made with use of a tablet type information terminal device as an example of the electronic device, but the electronic device is not limited thereto. For example, the electronic device may be an electronic device including a touch panel, such as a mobile phone, a PDA, a game machine, a car navigation device, and an ATM.

Further, description has been made with use of the touch panel 102 as an example of the panel, but the panel is not limited thereto. The panel only needs to be a pad such as a touch-pad, which has a plane and receives an input from the operator on the plane, and may be an electronic device without the display portion.

First, the structure of the support 202 is not limited to a structure described in the embodiment above, and may be a structure other than the structure described in the embodiment above as long as the rigidity of the first region is smaller than that of the second region. For example, the first region 202a and the second region 202b of the support 202 may be made of a first material and a second material, respectively, and the first material may have a rigidity smaller than that of the second material.

Further, when it is unnecessary to provide the water-proofing and dust-proofing functions to the support 202, the member forming the support 202 may not be provided at the first region 202a of the support 202, to thereby set the rigidity of the first region 202a smaller than that of the second region 202b. In this case, the rigidity of the first region 202a may be adjusted by changing the length of the first region 202a in the extending direction, in other words, the interval of the second regions 202b sandwiching the first region 202a. Alternatively, the thickness (width in the Z direction) of the first region 202a of the support 202 may be set smaller than the thickness of the second region 202b.

Figure 8A:
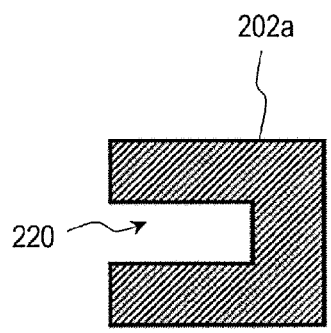
FIGS. 8A to 8F illustrate other examples of a cross section of a first region of the support.
Figure 8B:
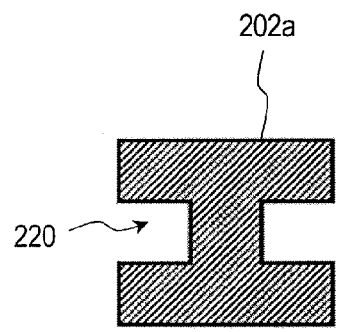
Figure 8C:
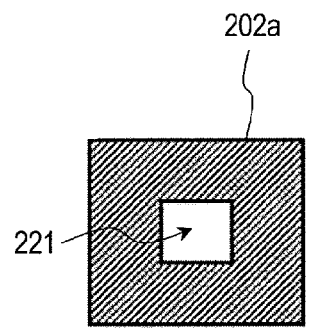

Further, when the support 202 is formed of the same material, in a plane perpendicular to the direction in which the support 202 extends, the cross section area of the first region 202a may be set smaller than the cross section area of the second region 202b, to thereby reduce the rigidity in the first region 202a. Specifically, as illustrated in FIGS. 8A and 8B, a cutout 220 may be provided in one or two surfaces that do not come into contact with the touch panel 102 and the base 201. Further, as illustrated in FIG. 8C, a hollow part 221 may be provided inside.

Figure 8D:
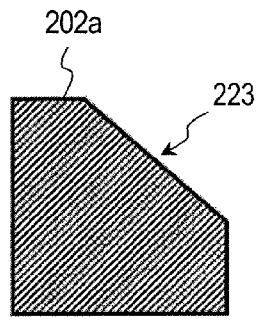
Figure 8E:
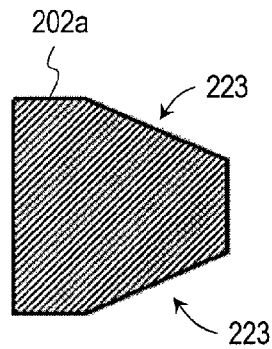
Figure 8F:
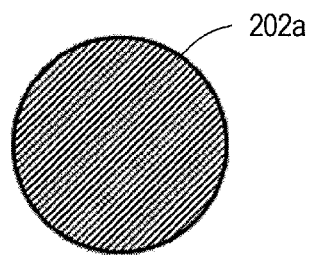

Further, as illustrated in FIG. 8D, the cross section of the first region 202a of the support 202 may have a chamfered portion 223 on a side which comes into contact with the touch panel 102. Further, as illustrated in FIG. 8E, the cross section of the first region 202a of the support 202 may have the chamfered portions 223 on sides which come into contact with the touch panel 102 and the base 201. Further, as illustrated in FIG. 8F, the cross section of the first region 202a of the support 202 may have a circular shape.

Further, in this embodiment, the support 202 is formed over the entire periphery, but may be formed partially. In this case, similar effects can be obtained even when the rigidity is changed by the interval forming the support 202.

Further, in FIG. 6A, the first region 202a is arranged at a position suitable for the node 502 of vibration in the f30 mode, but when other modes are used, the first region 202a may be arranged at a position suitable for the corresponding mode.

The plurality of vibrators 210 may be arranged equally on four sides of the touch panel 102, or may be arranged in a plurality of sets on only the short side or the long side. Further, one first region 202a may be arranged on each of one of the short sides and one of the long sides.

Further, in this embodiment, description has been made of a case of a single vibration mode, but when a plurality of vibration modes are selectively used, similar effects can be obtained by forming the first region 202a at a part corresponding to the node of any one of the vibration modes. Further, when the positions of the nodes of the plurality of vibration modes are close to each other, the first region 202a may be formed so as to cover both of the nodes.

Further, in this embodiment, the vibrators 210a and 210b are bonded onto the touch panel 102, but alternatively, a thin-film transparent piezoelectric member may be formed on the touch panel 102 by a method such as sputtering for use as the vibrator.

Note that, in this case, an example in which the vibrators 210a and 210b are physically connected to the touch panel 102 has been described, but it is unnecessary to directly connect the vibrators 210a and 210b to the touch panel 102. As long as the touch panel 102 can be vibrated, the vibrators 210a and 210b may be connected to a member other than the touch panel 102.

Further, when a plurality of vibrators are provided, some of those vibrators may not be operated. With this, the power consumption can be reduced.

Further, regarding the drive phase, an example of in phase (phase difference of 0°) and antiphase (phase difference of 180°) has been described, but an arbitrary phase difference other than 0° and 180° may be set for adjustment to an optimum amount by maximizing or minimizing the vibration amplitude at a certain location of the touch panel 102.

Further, the drive portion 301 may cause the vibrators 210a and 210b to vibrate by not only a sine wave but also a waveform obtained by subjecting the envelope of the sine wave to modulation by an arbitrary waveform. With this, the user can feel various senses of touch such as hard, soft, and textured.

As described above, the embodiments have been described as an example of the technology of this disclosure, and the attached drawings and detailed description are provided therefor.

Therefore, the components illustrated and described in the attached drawings and detailed description may include not only components essential to solve the problem so as to exemplify the above-mentioned technology, but also components not essential to solve the problem. Therefore, it may not be immediately recognized that those inessential components are essential because those inessential components are illustrated and described in the attached drawings and detailed description.

Further, the above-mentioned embodiments are provided to exemplify the technology of this disclosure, and hence various changes, replacements, additions, and omissions may be made thereto within the scope of claims or the scope equivalent thereto.

This disclosure is applicable to an electronic device including a contact-type input surface for various applications. Specifically, this disclosure is applicable to a personal digital assistant device such as a tablet, an electronic book, and a smart phone, a display for a computer, a car navigation device, an ATM, and a ticket-vending machine.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed:

1. A piezoelectric element, comprising:
   a piezoelectric body having a mounting surface and at least one other surface;
   a plurality of first internal electrodes and a plurality of second internal electrodes alternately arranged at given intervals inside the piezoelectric body;
   a first terminal electrically connected to the plurality of first internal electrodes and formed on the at least one other surface of the piezoelectric body;
   a second terminal electrically connected to the plurality of second internal electrodes and formed on the at least one other surface;
   a reference electrode formed on the mounting surface of the piezoelectric body; and
   a third terminal electrically connected to the reference electrode and formed on the at least one other surface;
   wherein the reference electrode is maintained at a predefined DC potential.

2. The piezoelectric element according to claim 1,
   wherein a part of the piezoelectric body, in which the plurality of first internal electrodes and the plurality of second internal electrodes are arranged, is divided into a plurality of layers by the plurality of first internal electrodes and the plurality of second internal electrodes, and
   wherein, of the plurality of layers, a layer located on an outermost side has a thickness larger than a thickness of a layer located inside.

3. The piezoelectric element according to claim 1, wherein the reference electrode is formed on substantially the entire mounting surface of the piezoelectric body.

4. The piezoelectric element according to claim 1, wherein at least one of the first terminal, the second terminal, and the third terminal is formed on a surface located at an opposite side to the mounting surface in the piezoelectric body.

5. The piezoelectric element according to claim 1, wherein the third terminal is located between the first terminal and the second terminal.

6. The piezoelectric element according to claim 1, further comprising an insulator layer on an outer side of the reference electrode formed on the mounting surface of the piezoelectric body.

7. An electronic device, comprising the piezoelectric element according to claim 1.

8. The electronic device according to claim 7, wherein the third terminal is connected to a ground of the electronic device.

* * * * *